United States Patent
Imai

(10) Patent No.: US 8,354,645 B2
(45) Date of Patent: Jan. 15, 2013

(54) RADIATION SENSOR AND RADIATION IMAGE DETECTION APPARATUS

(75) Inventor: Shinji Imai, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 203 days.

(21) Appl. No.: 12/952,604

(22) Filed: Nov. 23, 2010

(65) Prior Publication Data

US 2011/0127439 A1   Jun. 2, 2011

(30) Foreign Application Priority Data

Nov. 27, 2009   (JP) ................. 2009-270511

(51) Int. Cl.
- *G01T 1/24* (2006.01)
- *G01N 23/04* (2006.01)
- *G01N 21/64* (2006.01)

(52) U.S. Cl. ............. 250/370.08; 250/591; 250/484.4

(58) Field of Classification Search ............ 250/370.08, 250/370.11, 591, 580, 484.4; 257/429, E31.086
See application file for complete search history.

(56) References Cited

U.S. PATENT DOCUMENTS 7,220,981 B2 * 5/2007 Imai ............................ 250/591
2007/0257217 A1   11/2007 Imai

FOREIGN PATENT DOCUMENTS

| JP | 2004-172375 A | 6/2004 |
| JP | 2006-165530 A | 6/2006 |

* cited by examiner

*Primary Examiner* — David Porta
*Assistant Examiner* — Faye Boosalis
(74) *Attorney, Agent, or Firm* — Birch, Stewart, Kolasch & Birch, LLP

(57) ABSTRACT

Provided are a radiation sensor having a first flexible substrate provided with a phosphor layer which converts incident radiation into an electromagnetic wave in a wavelength region that is at least different from that of the radiation; an organic photoelectric conversion layer which includes a charge transport layer and a charge generation layer containing a charge transporting agent and 55% by mass to 75% by mass of a polymer binder, and photoelectrically converts the electromagnetic wave; a second flexible substrate provided with a charge detection layer which includes a storage capacitor and a thin film transistor and is adapted to read electrical charge generated at the organic photoelectric conversion layer; and a polymer subbing layer disposed between the organic photoelectric conversion layer and the charge detection layer, and a radiation image detection apparatus using the radiation sensor.

15 Claims, 1 Drawing Sheet

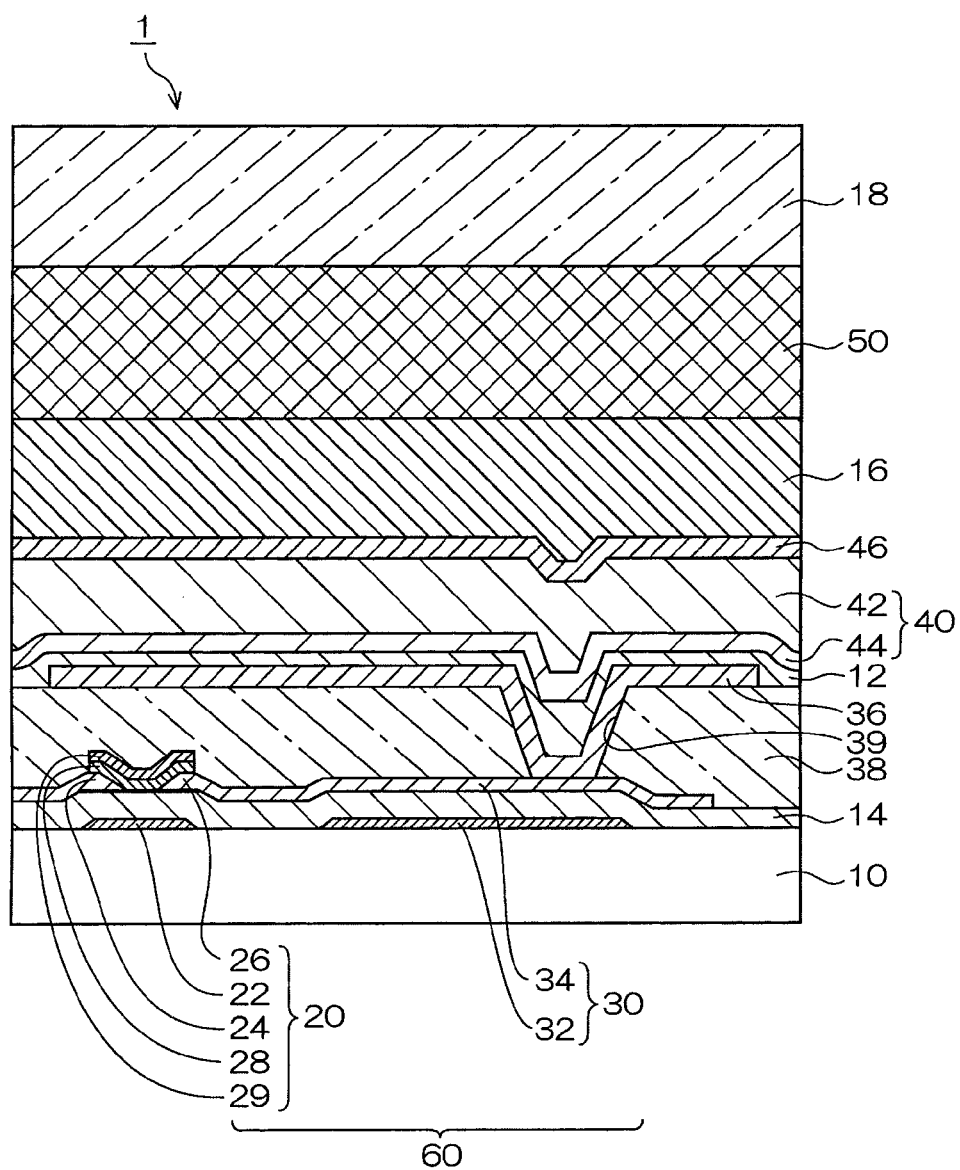

RADIATION SENSOR AND RADIATION IMAGE DETECTION APPARATUS

CROSS-REFERENCE TO RELATED APPLICATION

This application claims priority under 35 USC 119 from Japanese Patent Application No. 2009-270511, filed on Nov. 27, 2009, the disclosure of which is incorporated by reference herein.

BACKGROUND OF THE INVENTION

1. Field of the Invention

The present invention relates to a radiation sensor and a radiation image detection apparatus.

2. Description of the Related Art

In the field of medicine, use is being made of a radiation sensor which irradiates a human body with radiation such as X-ray, detects the intensity of the radiation that has penetrated the human body, and thereby detects the images of the inside of the human body. One type of such a radiation sensor is a system which first enters radiation that has transmitted into the human body, into a phosphor to thereby convert the radiation into visible light, converting this visible light into electrical signals, and then extracting the electrical signals to the outside.

As such a radiation sensor, for example, there is known a radiation sensor in which a shock-resistant phosphor layer composed of a polymer binder and a phosphor that is sensitive to radiation, such as gadolinium oxysulfide; an upper electrode; a lower electrode; and a shock-resistant substrate which is disposed between the upper and lower electrodes, and has an organic photoelectric conversion layer that absorbs the light emitted by the radiation incident to the phosphor layer to convert the light to charges, and a charge detection layer that includes a storage capacitor and a thin film transistor unit for reading the charges generated in the organic photoelectric conversion layer from each of the pixels for image detection (see Japanese Patent Application Laid-Open (JP-A) No. 2004-172375). Furthermore, since a thin film transistor which has an oxide semiconductor active layer containing zinc oxide, may be formed into a film at low temperature, an insulating substrate having flexibility, such as a plastic plate or a plastic film, may be used (see JP-A No. 2006-165530).

The radiation sensors described above have a flexible substrate that supports a phosphor layer and a shock-resistant substrate having a charge detection layer; however, the organic photoelectric conversion layer still lacks flexibility, and when the radiation sensors are bent, the image detecting performance may undergo deterioration.

SUMMARY OF THE INVENTION

The present invention has been made in view of the above circumstances and provides a radiation sensor and a radiation image detection apparatus.

A first aspect of the present invention provides a radiation sensor including:

a first flexible substrate provided with a phosphor layer which converts incident radiation into an electromagnetic wave in a wavelength region that is at least different from that of the radiation;

an organic photoelectric conversion layer which includes a charge generation layer and a charge transport layer containing a charge transporting agent and 55% by mass to 75% by mass of a polymer binder, and photoelectrically converts the electromagnetic wave;

a second flexible substrate provided with a charge detection layer which includes a storage capacitor and a thin film transistor and is adapted to read electrical charge generated at the organic photoelectric conversion layer; and a polymer subbing layer disposed between the organic photoelectric conversion layer and the charge detection layer.

A second aspect of the present invention provides a radiation image detection apparatus including:

a radiation irradiation apparatus;

the radiation sensor according to the first aspect of the present invention; and a memory unit that accumulates charge data for pixel units detected at the charge detection layer of the radiation sensor.

BRIEF DESCRIPTION OF THE DRAWINGS

FIG. 1 is a cross-sectional view showing an example of one pixel unit related to an exemplary embodiment of the radiation sensor according to the invention.

DETAILED DESCRIPTION OF THE INVENTION

FIG. 1 is a cross-sectional view schematically showing the constitution of one pixel unit of the radiation sensor related to an exemplary embodiment of the radiation sensor according to the present invention. The radiation sensor 1 in FIG. 1 includes a phosphor layer 50 which, when an imaging target as an object of imaging is irradiated with radiation, converts the radiation that has penetrated the imaging target, into light, and this phosphor layer is provided on one of the surfaces of a first flexible substrate 18 such as a polyethylene terephthalate film.

Furthermore, the radiation sensor has a charge detection layer 60 which includes a storage capacitor 30 and a thin film transistor 20, on one of the surfaces of a second flexible substrate 10. The storage capacitor 30 is constituted of a upper storage capacitor electrode 34 and a lower storage capacitor electrode 32, and a dielectric layer 14 disposed between these electrodes (this dielectric layer 14 also functions as an insulating film). Furthermore, this thin film transistor 20 has a source electrode 24, a drain electrode 26 that is connected to the upper storage capacitor electrode 34, an oxide semiconductor active layer (channel layer) 28 that is disposed between these source electrode 24 and drain electrode 26, a protective layer 29 formed to cover the oxide semiconductor active layer 28, and a gate electrode 22 that is positioned to face the oxide semiconductor active layer 28, with the dielectric layer 14 that functions as an insulating film being interposed between the gate electrode and the oxide semiconductor active layer.

A first interlayer insulating film 38 is disposed on the charge detection layer 60, and this first interlayer insulating film 38 has a contact hole 39 on the upper storage capacitor electrode 34. A charge collection electrode 36 is disposed on the first interlayer insulating film 38, and this charge collection electrode 36 is electrically connected to the upper storage capacitor electrode 34 at the contact hole 39.

The radiation sensor has an organic photoelectric conversion layer 40 which includes a charge generation layer 44 and a charge transport layer 42, and a bias electrode 46, disposed in this sequence on the charge collection electrode 36, with a polymer subbing layer 12 interposed between the charge collection electrode 36 and the charge generation layer 44.

The bias electrode 46 and the phosphor layer 50 are superimposed so as to face each other, with a second interlayer insulating film 16 being interposed therebetween.

The radiation sensor 1 according to the aspect of the invention is technically characterized in that the charge transport layer 42 contains a charge transport agent and 55% by mass to 75% by mass of a polymer binder, and that the radiation sensor has a polymer subbing layer 12. Thereby, the charge transport layer 42 has flexibility, and at the same time, the presence of the polymer subbing layer 12 prevents the peeling of the organic photoelectric conversion layer 40 to occur. Accordingly, even if the radiation sensor 1 is bent, there is no occurrence of the image detection performance undergoing deterioration.

Hereinafter, the respective constituent elements used in the radiation sensor according to the aspect of the invention will be sequentially explained in detail.

<First Flexible Substrate>

Preferred examples of the first flexible substrate 18 include plastic films or plastic plates, which are produced by forming a film using a plastic material such as polyethylene terephthalate (PET), polyethylene naphthalate (PEN), all-aromatic polyamide, polyimide or polycarbonate. The examples further include composite films or composite plates, obtainable by adhering a thin glass film and a plastic film, as well as metal plates. The thickness of the first flexible substrate is selected in a range of, for example, 50 µm to 200 µm.

<Phosphor Layer>

The phosphor layer 50 is formed by preparing a coating liquid in which a phosphor is dispersed in a polymer binder solution, applying this coating liquid on the first flexible substrate 18 by doctor blade coating or the like, and drying the coating liquid.

The phosphor is preferably a substance which, when irradiated with radiation, emits an electromagnetic wave in a different wavelength region from that of the irradiated radiation, and more preferably a substance which emits light having a maximum peak wavelength in the range of 500 nm to 600 nm. Examples of such a phosphor include gadolinium oxysulfide and cesium iodide. This gadolinium oxysulfide is preferably a substance containing terbium or the like, and the cesium iodide is preferably a substance added with thallium.

Examples of the polymer binder include polyvinyl butyral and polycarbonate.

The ratio of the phosphor and the polymer binder is preferably selected such that the mass ratio of the phosphor: polymer binder is in the range of 50:50 to 90:10, from the viewpoint of maintaining the sensitivity and sharpness.

The thickness of the phosphor layer 50 is selected in the range of 50 µm to 600 µm.

<Second Flexible Substrate>

As the second flexible substrate 10, a plastic substrate formed from polycarbonate, polyethylene terephthalate (PET), polyethylene naphthalate (PEN), all-aromatic polyamide, polyimide or the like; a composite substrate having, for example, a thin glass layer having a thickness in the range of 0.03 mm to 0.2 mm, on a plastic film such as mentioned above; a metal substrate provided with an insulating layer; or the like may be used. Among these, when a plastic substrate or the aforementioned composite substrate is used, a sensor capable of retaining a light weight and a robustness that prevents any functional impairment even under an impact due to dropping or the like, may be obtained, which is particularly preferable.

In order to suppress the permeation of oxygen and moisture, it is preferable that a barrier layer such as a SiON film, which is not shown in the diagram, be formed over the entire surface of the second flexible substrate 10 on the side where the charge detection layer 60 is formed.

The thickness of the second flexible substrate 10 is preferably selected in the range of, for example, 50 µm to 200 µm, from the viewpoints of strength and flexibility.

The second flexible substrate 10 may have, on the surface of the side opposite to the side where the charge detection layer 60 is formed (hereinafter, also referred to as "rear surface of the second flexible substrate 10"), a light shielding layer that blocks or absorbs light having a wavelength at least in the range of 400 nm to 460 nm. This light shielding layer blocks, or decreases the intensity of, the light having a wavelength in the range of 400 nm to 460 nm, which enters the oxide semiconductor active layer 28 from the rear surface of the second flexible substrate 10, and therefore, operational unstabilization of the thin film transistor due to this light is prevented.

An example of the light shielding layer may be a polymer binder layer containing carbon black, or a dye or pigment which absorbs at least a light having a wavelength in the range of 400 nm to 460 nm.

<Lower Storage Capacitor Electrode and Gate Electrode>

Suitable examples of the material used in the lower storage capacitor electrode 32 and the gate electrode 22 include metals such as aluminum (Al), molybdenum (Mo), chromium (Cr), tantalum (Ta), titanium (Ti), gold (Au) and silver (Ag); alloys such as an aluminum-neodymium (Al—Nd) alloy and a silver-palladium-copper (APC) alloy; electrically conductive films of metal oxides such as tin oxide, zinc oxide, indium oxide, indium tin oxide (ITO) and indium zinc oxide (IZO); organic electrically conductive compounds such as polyaniline, polythiophene and polypyrrole; and mixtures thereof.

The thicknesses of the lower storage capacitor electrode 32 and the gate electrode 22 are both set at, for example, from 10 nm to 1000 nm, and preferably 30 nm to 300 nm.

In order to form the lower storage capacitor electrode 32 and the gate electrode 22 on the second flexible substrate 10, materials such as described above that are used in the electrodes, are formed into films by, for example, sputtering on the second flexible substrate 10, and the films are respectively patterned by photolithography and etching to have the respective positions and shapes in accordance with the electrodes 32 and 22.

<Dielectric Layer>

Next, the dielectric layer 14 which also functions as an insulating film is formed on the gate electrode 22 and the lower storage capacitor electrode 32.

Examples of the material used in the dielectric layer 14 include inorganic oxides such as silicon dioxide; and organic polymer compounds such as an acrylic resin, a novolac resin, and a polyimide resin.

The dielectric layer 14 is formed by an appropriate method in accordance with the material used. For example, in the case of an organic oxide such as silicon dioxide, film formation is preferably carried out by sputtering. On the other hand, in the case of an organic polymer compound such as an acrylic resin or a novolac resin, the dielectric layer is formed according to a known method such as, for example, a spin coating method, a spray coating method or a screen printing method. When an organic polymer compound is used, it is preferable to further provide thereon a $SiO_2$ film to a thickness of, for example, 20 nm, by a sputtering method, a chemical vapor deposition (CVD) method or the like.

It is preferable to set the thickness of the dielectric layer 14 in the range of 50 nm to 500 nm, from the viewpoint of the functions as a dielectric layer of the storage capacitor 30 and as an insulating film of the thin film transistor 20.

<Source/Drain Electrodes and Upper Storage Capacitor Electrode>

Next, the source electrode 24 and the drain electrode 26 of the thin film transistor (hereinafter, also referred to as "TFT") 20, and the upper storage capacitor electrode 34 of the storage capacitor 30 are formed on the dielectric layer 14.

Examples of the material that constitutes the source electrode 24, drain electrode 26, and the upper storage capacitor electrode 34 of the storage capacitor (hereinafter, also referred to as "capacitor") 30 include $In_2O_3$—ZnO (hereinafter, also referred to as "IZO"), ITO, Mo and Al.

The source electrode 24, drain electrode 26 and upper storage capacitor electrode 34 are prepared in the same manner as in the case of forming the lower storage capacitor electrode 32 and the gate electrode 22 described above, for example, by forming IZO ($In_2O_3$—ZnO) films by photolithography and etching to have the predetermined positions and shapes. At this time, patterning is carried out so that the drain electrode 26 of the TFT 20 and the upper storage capacitor electrode 34 of the capacitor 30 are electrically connected to each other. The respective thicknesses of the electrodes 24, 26 and 34 are preferably set in the range of 10 nm to 1000 nm.

<Oxide Semiconductor Active Layer>

The oxide semiconductor active layer 28 is formed on the source electrode 24 and the drain electrode 26 so as to extend over these two electrodes.

The oxide semiconductor active layer 28 is formed from, for example, an oxide semiconductor of an In—Ga—Zn—O system, and preferably from an amorphous oxide semiconductor. The amorphous oxide semiconductor is advantageous in that since film formation may be achieved at low temperature by sputtering, a plastic substrate may be used as the second flexible substrate 10. The oxide semiconductor is preferably an oxide containing at least one of indium (In), gadolinium (Ga) or zinc (Zn) (for example, an In—O system), more preferably an oxide containing at least two of In, Ga and Zn (for example, an In—Zn—O system, an In—Ga system, a Ga—Zn—O system), and particularly preferably an oxide containing In, Ga and Zn. The amorphous oxide of an In—Ga—Zn—O system is preferably an amorphous oxide having a composition in the crystalline state represented by the formula: $InGaO_3(ZnO)_m$ (wherein m represents a natural number of less than 6), and more preferably the formula: $InGaZnO_4$ (hereinafter, also referred to as "IGZO").

In the case of using an oxide semiconductor active layer formed from the amorphous oxide semiconductor of an In—Ga—Zn—O system as described above, film formation may be achieved at low temperature by sputtering. A film of the amorphous oxide semiconductor of an In—Ga—Zn—O system may be patterned by photolithography and etching in accordance with the respective oxide semiconductor active layers 28 to be formed, or the oxide semiconductor active layer 28 may be formed to have a predetermined position and shape, by introducing thereon a mask having through-holes in accordance with the oxide semiconductor active layer 28 to be formed. The thickness of the oxide semiconductor active layer 28 is preferably set in the range of 10 nm to 50 nm, from the viewpoint that the channels acquire satisfactory electrical conductivity.

It is preferable to form a protective layer 29 on the oxide semiconductor active layer 28 to cover the active layer. As a result, there is obtained an advantage that the influence of moisture in the atmosphere is suppressed.

A gallium oxide film is preferable as the protective layer 29. The thickness of the protective layer 29 is generally set in the range of 10 nm to 200 nm.

The source electrode 24, drain electrode 26 and oxide semiconductor active layer 28 may be formed in the opposite order in the vertical direction. That is, after the oxide semiconductor active layer 28 is formed, the source electrode 24 and the drain electrode 26 may be formed thereon.

<First Interlayer Insulating Film>

On the charge detection layer 60 formed by providing a storage capacitor 30 and a thin film transistor 20 in the manner as described above, there is formed a first interlayer insulating film 38.

The first interlayer insulating film 38 is formed by, for example, applying and drying an acrylic or methacrylic photosensitive resin solution on the charge detection layer 60 according to a known method such as a spin coating method, a spray coating method or a screen printing method, subsequently exposing the photosensitive resin layer so that the contact hole 39 is formed at a predetermined position, and performing a development treatment to thereby remove the photosensitive resin at the position of the contact hole 39. As a result, the first interlayer insulating film 38 having the contact hole 39 is formed on the charge detection layer 60. The contact hole 39 is formed such that the diameter at the surface that is farthest from the upper storage capacitor electrode 34 in the thickness direction of the first interlayer insulting film 38 is, for example, 14 μm, and the diameter is gradually decreased toward the upper storage capacitor electrode 34.

Instead of forming the photosensitive resin layer by applying and drying a photosensitive resin solution as described above, the photosensitive resin layer may also be formed by a so-called transfer method, in which a transfer material having a photosensitive resin layer formed in advance on a temporary support by applying and drying a photosensitive resin solution thereon, is provided, subsequently the photosensitive resin layer of this transfer material is attached on the charge detection layer 60, and then the temporary support is removed by peeling. In regard to the composition of the photosensitive resin and the transfer material used in this transfer method, those described in, for example, JP-A No. 2002-131899 may be used.

The thickness of the first interlayer insulating film 38 is preferably selected in the range of 1 μm to 100 from the viewpoint that the first interlayer insulating film functions as a flattening layer for damping the surface unevenness of the charge detection layer 60, and that the contact hole 39 is satisfactorily formed.

<Charge Collection Electrode>

On the first interlayer insulating film 38 having the contact hole 39, the charge collection electrode 36 is formed. The charge collection electrode 36 is formed by sputtering film formation using a material such as ITO, IZO, Mo or Al. The charge collection electrode 36 is electrically connected to the upper storage capacitor electrode 34 through the contact hole 39.

The thickness of the charge collection electrode 36 is set in the range of, for example, 10 nm to 1000 nm.

<Polymer Subbing Layer>

On the charge collection electrode 36, the polymer subbing layer 12 is formed. The polymer subbing layer 12 is preferably selected from a film having a function of strongly binding the charge collection electrode 36 and the organic photoelectric conversion layer 40 (particularly, charge generation layer 44). Examples of such polymer subbing layer 12 include a film formed by applying and drying a solvent solution of an organic polymer such as an alcohol-soluble polyamide or an alcohol-soluble nylon, and a sol-gel film obtained by subjecting a metal alkoxide to hydrolysis and condensation. In particular, the latter sol-gel film is preferred.

Examples of the metal alkoxide used in the formation of a sol-gel film include an alkoxysilane, an alkoxytitanium and an alkoxyzirconium, and these compounds may be used singly, or two or more kinds may be used in combination.

Examples of the alkoxysilane include tetramethoxysilane, tetraethoxysilane, methyltriethoxysilane, propyltriethoxysilane, and acryloyloxypropyltrimethoxysilane.

Examples of the alkoxytitanium include tetraethoxytitanium, tetraisopropoxytitanium, and tetrabutoxytitanium.

Examples of the alkoxyzirconium include tetraethoxyzirconium, tetraisopropoxyzirconium, and tetrabutoxyzirconium.

The hydrolysis or condensation reaction of the metal alkoxide can be carried out with or without solvent. For uniformly mixing components, the reaction is preferably carried out with an organic solvent. Preferable examples of the solvent include organic solvents such as alcohols, aromatic hydrocarbons, ethers, ketones, or esters. The solvent is preferably capable of dissolving the silane compound and a catalyst. It is also preferable to use a solvent as a coating liquid or a part of a coating liquid from the viewpoint of the process.

Among them, examples of alcohols include monovalent or divalent alcohols. Among monovalent alcohols, saturated aliphatic alcohols having 1 to 8 carbon atoms are preferable. Specific examples of the alcohols include methanol, ethanol, n-propyl alcohol, i-propyl alcohol, n-butyl alcohol, sec-butyl alcohol, tert-butyl alcohol, ethylene glycol, diethylene glycol, triethylene glycol, ethylene glycol monobutyl ether, and ethylene glycol acetate monoethyl ether.

Specific examples of aromatic hydrocarbons include benzene, toluene, and xylene. Specific examples of ethers include tetrahydrofuran and dioxane. Specific examples of ketones include acetone, methyl ethyl ketone, methyl isobutyl ketone, and diisobutyl ketone. Specific examples of esters include ethyl acetate, propyl acetate, butyl acetate, and propylene carbonate.

These organic solvents may be used alone or in combination of two or more of them. The concentration of the solid content in the hydrolysis or condensation reaction is not particularly limited, but usually in the range of 1% by mass to 90% by mass, and preferably in the range of 20% by mass to 70% by mass.

The hydrolysis and condensation reactions of the metal alkoxide are preferably carried out in the presence of a catalyst. Examples of the catalyst include organic acids such as oxalic acid, acetic acid, formic acid, methanesulfonic acid, or toluenesulfonic acid; inorganic salt groups such as ammonia; organic bases such as triethylamine or pyridine; and metal alkoxides such as triisopropoxy aluminum or tetrabutoxy zirconium. Among them, organic acids and metal alkoxides are preferable from the viewpoints of stability of preparation and storage stability of a sol solution.

Among organic acids, organic acids having an acid dissociation constant (pKa value ($25°$ C.)) of 4.5 or lower in water are preferable, organic acids having an acid dissociation constant of 3.0 or lower in water are more preferable, organic acids having an acid dissociation constant of 2.5 or lower in water are further preferable, methanesulfonic acid, oxalic acid, phthalic acid, and malonic acid are further preferable, and oxalic acid is particularly preferable.

The hydrolysis or condensation reaction is usually carried out by adding 0.3 mol to 2 mol, and preferably 0.5 mol to 1 mol, of water relative to 1 mol of a hydrolysable group of the metal alkoxide compound, and carrying out stirring at $25°$ C. to $100°$ C. in the presence or absence of the above-mentioned solvent, preferably in the presence of the catalyst.

When the hydrolysable group is an alkoxide and the catalyst is an organic acid, the addition amount of the water may be reduced so that the carboxyl group or sulfo group of the organic acid supplies protons. The addition amount of the water relative to 1 mol of the alkoxide group of the metal alkoxide is 0 mol to 2 mol, preferably 0 mol to 1.5 mol, more preferably 0 mol to 1 mol, and particularly preferably 0 mol to 0.5 mol. When an alcohol is used as the solvent, the addition of substantially no water is also preferable.

When the catalyst is an organic acid, the optimal usage of the catalyst varies with the addition amount of water, and when water is added, 0.01 mol % to 10 mol %, preferably 0.1 mol % to 5 mol % relative to the total hydrolysable groups, and when substantially no water is added, 1 to 500 mol %, preferably 10 mol % to 200 mol %, more preferably 20 mol % to 200 mol %, further preferably 50 mol % to 150 mol %, and most preferably 50 mol % to 120 mol % relative to the hydrolysable groups. The reactions are carried out by stirring at $25°$ C. to $100°$ C., and preferably adjusted as appropriate according to the reactivity of the metal alkoxide.

In this manner as described above, the hydrolysate or a partial condensation product of the metal alkoxide (hereinafter, these may be referred to as "sol composition") is obtained.

This sol composition is applied on the charge collection electrode 36 and the first interlayer insulating film 38, and turn into a gel to obtain a gel-like composition. As such, the polymer subbing layer 12 containing the gel-like composition is formed.

As the above-mentioned coating method, various methods can be used, such as air doctor coating, blade coating, rod coating, extrusion coating, air knife coating, squeeze coating, impregnation coating, reverse roll coating, transfer roll coating, gravure coating, kiss-roll coating, cast coating, spray coating, or spin coating.

Gelation of the sol composition may be achieved by applying various methods. For example, it is preferable to perform a heat treatment of heating at $100°$ C. to $250°$ C., and preferably $120°$ C. to $200°$ C.

The thickness of the polymer subbing layer 12 is preferably selected in the range of 0.02 μm to 1 μm, from the viewpoint that the charge collection electrode 36 and the organic photoelectric conversion layer 40, particularly the charge generation layer 44 are firmly adhered, the flexibility of the organic photoelectric conversion layer 40 is not decreased, charge accumulation is prevented, and repetition stability of the sensitivity is improved. The thickness of the polymer subbing layer 12 is more preferably selected in the range of 0.05 μm to 0.2 μm.

<Organic Photoelectric Conversion Layer>

The organic photoelectric conversion layer 40 is formed on the polymer subbing layer 12. The organic photoelectric conversion layer 40 includes the charge generation layer 44 and the charge transport layer 42.

<Charge Generation Layer>

The charge generation layer 44 is preferably formed on the polymer subbing layer 12.

The charge generation layer 44 contains a charge generating agent and a polymer binder as constituent components. Examples of the charge generating agent include a phthalocyanine dye or phthalocyanine pigment such as a metallophthalocyanine or metal-free phthalocyanine; a naphthalocyanine dye or naphthalocyanine pigment; an indigo pigment; a quinacridone dye; an anthraquinone dye; an anthanthrone dye such as, for example, dibromoanthanthrone; a perylene dye;

an azo dye such as, for example, a monoazo dye, a bisazo dye or a trisazo dye; and a cyanine dye.

The charge generating agent is preferably selected in accordance with the type of the phosphor used in the phosphor layer 50. Specifically, the charge generating agent is selected from a charge generating agent capable of absorbing an electromagnetic wave emitted by the phosphor when irradiated with radiation, and more preferably a charge generating having a maximum absorption wavelength at a wavelength which differs by 50 nm or less from the maximum peak wavelength of the electromagnetic wave emitted as described above. For example, when gadolinium oxysulfide or cesium iodide is used as the phosphor, these phosphors emit electromagnetic waves having the maximum peak wavelength at 550 nm when irradiated with radiation. Therefore, a dibromoanthanthrone pigment which absorbs light having a wavelength in the range of 400 nm to 600 nm, or quinacridone which has an absorption peak wavelength at 560 nm is used as the charge generating agent.

Examples of the polymer binder that is used in the charge generation layer 44 include polyvinyl butyral.

The ratio of the charge generating agent and the polymer binder is preferably selected such that the mass ratio of the charge generating agent:polymer binder is in the range of 80:20 to 20:80, from the viewpoint of achieving a good balance between the stability in sensitivity and the stability over time. More preferably, the ratio is selected in the range of 45:55 to 25:75.

The charge generation layer 44 is formed by preparing a dispersion liquid in which a charge generating agent is dispersed in a solution containing a polymer binder in a solvent, spin coating this dispersion liquid on the polymer subbing layer 12, and drying (also referred to as baking) to evaporate the solvent.

The thickness of the charge generation layer 44 is preferably selected in the range of 0.1 μm to 0.5 μm, from the viewpoint of obtaining satisfactory sensitivity.

<Charge Transport Layer>

The charge transport layer 42 contains a charge transporting agent and a polymer binder as constituent components. The radiation sensor according to the aspect of the invention is constitutionally characterized in that the charge transport layer 42 contains 55% by mass to 75% by mass of a polymer binder.

As the charge transporting agent, those known as hole transporting substances are used. Examples that may be used include a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyarylene compound, a fused aromatic carbocyclic compound (naphthalene derivatives, anthracene derivatives, phenanthrene derivatives, tetracene derivatives, pyrene derivatives, perylene derivatives, and fluoranthene derivatives), and a metal complex having a nitrogen-containing heterocyclic compound as a ligand. The charge transporting agent is not intended to be limited to these, and any organic compound having a smaller ionization potential than the organic compound used as the charge generating agent may be used as the charge transporting agent.

Examples of the polymer binder used in the charge transport layer 42 include polycarbonate, polyvinyl butyral, a homopolymer of an acrylic acid ester or a copolymer thereof with another copolymerizable monomer, a homopolymer of a methacrylic acid ester or a copolymer thereof with another copolymerizable monomer, a homopolymer of styrene or a copolymer thereof with another copolymerizable monomer such as acrylonitrile, and polysulfone.

The charge transport layer 42 contains 55% by mass to 75% by mass of the polymer binder. As a result, the charge transport layer 42 remains flexible, and when coupled with the polymer subbing layer 12, even when the radiation sensor according to the aspect of the invention is bent, separation of the organic photoelectric conversion layer 40 from the charge collection electrode 36 is prevented, and the photoelectric conversion characteristics do not deteriorate.

When the amount of the polymer binder is less than 55% by mass, the flexibility of the charge transport layer is insufficient. When a radiation sensor having such a charge transport layer is bent, the photoelectric conversion characteristics deteriorate, causing defects. On the other hand, when the amount of the polymer binder is greater than 75% by mass, the time taken for charge to move in the charge transport layer is excessively lengthened, and the performance of the radiation sensor becomes unsatisfactory.

The amount of the polymer binder contained in the charge transport layer 42 is preferably set at 60% by mass to 70% by mass.

The charge transport layer 42 is formed by preparing a solution containing a charge transporting agent and a polymer binder in a solvent, applying this solution on the charge generation layer 44 by, for example, dip coating or spin coating, and baking the solution to evaporate the solvent.

The thickness of the charge transport layer 42 is preferably selected in the range of 1 μm to 5 μm, from the viewpoint that the movement of charges in the charge transport layer 42 does not need to take a long time. The thickness of the charge transport layer 42 is more preferably selected in the range of 1.5 μm to 3.5 μm.

The organic photoelectric conversion layer 40 is formed as described above.

<Bias Electrode>

On the organic photoelectric conversion layer 40, the bias electrode 46 is formed. The material that constitutes the bias electrode 46 is selected from a material that transmits at least a part of the electromagnetic wave emitted by the phosphor layer 50 when the phosphor layer is irradiated with radiation, and more preferably light of the maximum peak wavelength. Specific examples of the material include IZO and ITO.

The thickness of the bias electrode 46 is generally set in the range of 40 nm to 200 nm.

The bias electrode 46 is superimposed and joined with the phosphor layer 50 formed on the first flexible substrate 18 described above, with the second interlayer insulating film 16 being interposed between the bias electrode and the phosphor layer, and thus the radiation sensor according to the aspect of the invention is obtained.

<Second Interlayer Insulating Film>

The second interlayer insulating film 16 is formed in the same manner as in the case of the first interlayer insulating film 38, using a photosensitive resin. However, the formation of a contact hole is unnecessary in the second interlayer insulating film The second interlayer insulating film 16 may be formed by preparing a solvent solution of a polymer such as an acrylic resin or a methacrylic resin, instead of the use of a photosensitive resin, applying this solution on the bias electrode 46, and drying the solution; or the second interlayer insulating film 16 may be formed by transferring a polymer layer formed in advance on a temporary support, onto the bias electrode 46. Furthermore, a double-sided adhesive tape having a transparent adhesive layer may be used such that the adhesive layer may be used as the second interlayer insulating film 16.

The thickness of the second interlayer insulating film 16 is selected in the range of, for example, 10 μm to 30 μm.

In the radiation sensor according to the aspect of the invention, radiation that has penetrated an object enters the phosphor layer 50, and is converted in this phosphor layer 50 into an electromagnetic wave having a wavelength of a wavelength region that is different from that of the radiation. This converted electromagnetic wave is converted to charges in the organic photoelectric conversion layer 40. The charges converted in the organic photoelectric conversion layer 40 move as a result of the difference in the voltages applied between the bias electrode 46 and the charge collection electrode 36, and are collected at the charge collection electrode 36. The collected charges are stored in the storage capacitor 30 constituted of the upper storage capacitor electrode 34 that is electrically connected to the charge collection electrode 36, the lower storage capacitor electrode 32, and the dielectric layer 14 that is disposed between these electrodes.

The charge detection layer 60 includes a number of pixel units that are spread in two-dimensional directions, which are not shown in the drawing, and each of the pixel units includes a storage capacitor 30 and a thin film transistor 20. The charges stored in the storage capacitor 30 are read by the thin film transistor 20.

Since the upper storage capacitor electrode 34 and the drain electrode 26 are electrically connected, the thin film transistor 20 is brought to the on-state by the input signals of the gate electrode 22, and thereby the charges stored in the storage capacitor 30 are extracted from the source electrode 24. The amount of charges generated by the electromagnetic wave thus irradiated is detected for each of the pixels, and the detected amounts are stored in, for example, a semiconductor memory unit in the form of data. The data stored in the semiconductor memory unit is outputted in the form of electrical signals, and thereby the detected images of the object as a whole may be obtained.

The radiation sensor according to the aspect of the invention is such that the organic photoelectric conversion layer 40, and in particular, the charge transport layer 42 therein, contains 55% by mass to 75% by mass of a polymer binder. As a result, the charge transport layer 42 maintains flexibility, and when the charge transport layer is coupled with the polymer subbing layer 12, even if the radiation sensor according to the aspect of the invention is bent, the photoelectric conversion characteristics are not deteriorated.

Particularly, when an oxide semiconductor active layer containing at least one of In, Ga or Zn, more preferably an oxide semiconductor active layer containing In, Ga and Zn, is used as the active layer 28 of the thin film transistor 20, since it is said that film formation is made possible at low temperature by sputtering, a plastic substrate such as one made of polyimide may be used as the second flexible substrate.

Therefore, the radiation sensor as a whole acquires flexibility, and thus even if the radiation sensor is bent, deterioration of the photoelectric conversion characteristics does not occur. Accordingly, a radiation sensor which achieves a good balance between impact resistance, robustness and operational stability is obtained.

Furthermore, when the radiation sensor is assembled, and particularly when the phosphor layer 50 formed on the first flexible substrate 18 is superimposed and joined onto the bias electrode 46 described above, with the second interlayer insulating film 16 being interposed therebetween, application of a mechanical stress (for example, peeling, heat, or impact) to the organic photoelectric conversion layer 40 is not completely avoidable. Accordingly, under certain circumstances, a radiation sensor having deteriorated photoelectric conversion characteristics may result in. However, in the radiation sensor according to the aspect of the invention, the charge transport layer 42 that occupies a large proportion in the thickness of the organic photoelectric conversion layer 40, contains 55% by mass to 75% by mass of a polymer binder, and the charge transport layer 42 maintains flexibility. Therefore, during the assembling of the radiation sensor, even if a mechanical stress is applied to the organic photoelectric conversion layer 40, there is no deterioration in the photoelectric conversion characteristics, and a radiation sensor having photoelectric conversion characteristics at a certain level or above is obtained.

The radiation sensor according to the aspect of the invention may lead to a significant advantage in the case of mounting the radiation sensor inside a light-weight, compact cassette. Particularly, when a plastic substrate such as a polyimide substrate is used as the second flexible substrate 10, even if the radiation sensor is subjected to impact due to mishandling and dropping of the cassette, a robustness that does not cause any impediment in the function may be maintained. Examples of the structure of such a cassette include the structure described in JP-A No. 2009-80103.

The radiation image detection apparatus using the radiation sensor according to the aspect of the invention includes a radiation irradiation apparatus, the radiation sensor described above, and a memory unit that accumulates the charge data of pixel units detected at the charge detection layer of the radiation sensor.

The charge data related to the radiation image accumulated in the memory unit are subjected to image processing as necessary, and then are stored in an image memory unit. The radiation image data that have been imaging processed and stored in the image memory unit, are controlled by a display apparatus and thereby displayed on the display unit as visible images.

EXAMPLES

Hereinafter, specific examples of the radiation sensor according to the aspect of the invention and a production method thereof will be described.

Example 1

A film was formed by sputtering Mo to a thickness of 40 nm on a second flexible substrate 10 produced by attaching a PEN film having a thickness of 0.1 mm to a thin glass plate having a thickness of 0.15 mm, and patterning was performed on the Mo film by photolithography and wet etching. Thus, a gate electrode 22 and a lower storage capacitor electrode 32 were formed.

A film of silicon dioxide was formed thereon by sputtering to a thickness of 200 nm, and thus a dielectric layer 14 which also served as an insulating film was formed.

Subsequently, a film of IZO was formed by sputtering to a thickness of 200 nm without introducing oxygen, and patterning was performed thereon by photolithography and wet etching. Thus, a source electrode 24, a drain electrode 26, and an upper storage capacitor electrode 34 were formed. The edge at which the source electrode 24 and the drain electrode 26 face each other was adjusted to have a tapering angle of 25°.

A film of IGZO was formed by sputtering to a thickness of 10 nm, and patterning was performed by photolithography and wet etching. Thus, an active layer 28 was formed.

A film of amorphous Ga$_2$O$_3$ was formed by sputtering to a thickness of 10 nm, and only the areas that cover the active layer 28 were left behind to serve as a protective layer 29.

A first interlayer insulating film 38 made from an acrylic resin was applied thereon, and a contact hole 39 was formed on the upper storage capacitor electrode 34. A film of IZO was formed thereon to a thickness of 40 nm, and patterning was performed to form a charge collection electrode 36.

An alcohol-soluble polyamide in the form of a coating liquid for forming a polymer subbing layer 12 was applied on the charge collection electrode 36 to a thickness of 0.1 µm, and the coating liquid was dried. Thus, the polymer subbing layer 12 was formed.

As a coating liquid for a charge generation layer 44, a dispersion prepared by adding and dispersing a dibromoanthanthrone pigment and a polyvinyl butyral resin in cyclohexanone at a mass ratio of dibromoanthanthrone:polyvinyl butyral of 50:50, was used. The dispersion was applied by spin coating, and thus a charge generation layer 44 having a thickness of 0.1 µm was formed.

3.5 g of N,N'-diphenyl-N,N'-bis(3-methylphenyl)-[1,1'-biphenyl]-4,4'-diamine as a charge transporting agent, and 6.5 g of polycarbonate (molecular weight: about 35000 to 40000) were dissolved in 35 g of methylene chloride. The solution was applied on the charge generation layer 44 by dip coating, and thus a charge transport layer 42 was formed. The charge transport layer was dried for one hour at 100° C., and then the film thickness was measured, which was found to be 2 µM.

A film of IZO was formed on the charge transport layer 42 to a thickness of 40 nm, and thus a bias electrode 46 was formed.

The assembly was put under high temperature storage for one hour at 100° C., in order to accelerate changes over time.

KODAK Lanex Regular (trade name, Ga$_2$O$_2$S:Tb 380 µm), which is a phosphor sheet manufactured by Eastman Kodak Co. was provided.

This phosphor layer 50 and the bias electrode 46 were attached, using an acrylic double-sided adhesive tape as an adhesive layer (thickness: 20 µm) to be disposed therebetween. Thus, a radiation sensor according to the aspect of the invention was produced.

A carbon plate having a thickness of 0.1 mm was attached to the rear surface of the second flexible substrate 10 to allow the radiation sensor to have a light shielding property to light having a wavelength at 400 nm to 460 nm.

This radiation sensor maintained the performance required of a radiation sensor even when dropped from an altitude of 1 m onto the floor. Furthermore, it was confirmed that when this radiation sensor was bent at a curvature of 100 mm, the radiation sensor similarly maintained the performance required of a radiation sensor.

Comparative Example 1

A radiation sensor was produced in the same manner as in Example 1, except that the content of the polycarbonate contained in the charge transport layer 42 was adjusted to 50% by mass. This radiation sensor maintained the performance required of a radiation sensor even when dropped from an altitude of 1 m onto the floor, but when the radiation sensor was bent at a curvature of 100 mm, a portion of the image data was missing. Thus, this radiation sensor could not be used as a radiation sensor.

Example 2

A radiation sensor was produced in the same manner as in Example 1, except that the content of the polycarbonate contained in the charge transport layer 42 was adjusted to 75% by mass. This radiation sensor maintained the performance required of a radiation sensor even when dropped from an altitude of 1 m onto the floor, and similarly maintained the performance required of a radiation sensor even when bent at a curvature of 100 mm. However, when the radiation sensor was continuously irradiated (10 shots, at an interval of 30 seconds) at a high dose (80 kVp, 300 mR), the amount of sensitivity decrease was twice as large as compared with the radiation sensor of Example 1.

Example 3

A radiation sensor was produced in the same manner as in Example 1, except that the content of the polycarbonate contained in the charge transport layer 42 was adjusted to 55% by mass. This radiation sensor maintained the performance required of a radiation sensor even when dropped from an altitude of 1 m onto the floor, and similarly maintained the performance required of a radiation sensor even when bent at a curvature of 100 mm. However, when the radiation sensor was repeatedly subjected to a repeated bending test at a curvature of 50 mm for 10,000 times, the amount of missing image data increased to two times as compared with the radiation sensor of Example 1.

The invention includes the following exemplary embodiments.

<1> A radiation sensor including:
a first flexible substrate provided with a phosphor layer which converts incident radiation into an electromagnetic wave in a wavelength region that is at least different from that of the radiation;
an organic photoelectric conversion layer which includes a charge generation layer and a charge transport layer containing a charge transporting agent and 55% by mass to 75% by mass of a polymer binder, and photoelectrically converts the electromagnetic wave;
a second flexible substrate provided with a charge detection layer which includes a storage capacitor and a thin film transistor and is adapted to read electrical charge generated at the organic photoelectric conversion layer; and
a polymer subbing layer disposed between the organic photoelectric conversion layer and the charge detection layer.

<2> The radiation sensor according to <1>, wherein the charge transport layer has a thickness of 1 µm to 5 µm.

<3> The radiation sensor according to <1> or <2>, wherein the polymer subbing layer is a sol-gel film obtainable by subjecting a metal alkoxide to hydrolysis and condensation.

<4> The radiation sensor according to <3>, wherein the metal alkoxide is at least one selected from an alkoxysilane, an alkoxytitanium or an alkoxyzirconium.

<5> The radiation sensor according to any one of <1> to <4>, wherein the phosphor layer contains a phosphor which, when irradiated with radiation, converts the radiation into light having a maximum peak wavelength in a range of 500 nm to 600 nm.

<6> The radiation sensor according to <5>, wherein the phosphor is cesium iodide or gadolinium oxysulfide.

<7> The radiation sensor according to any one of <1> to <6>, wherein the charge transport layer contains the polymer binder in an amount of 60% by mass to 70% by mass.

<8> The radiation sensor according to any one of <1> to <7>, wherein the polymer binder contained in the charge transport layer is at least one selected from the group consisting of polycarbonate, polyvinyl butyral, a homopolymer of an acrylic acid ester or a copolymer thereof with another copolymerizable monomer, a homopolymer of a methacrylic acid ester or a copolymer thereof with another copolymerizable monomer, a homopolymer of styrene or a copolymer thereof with another copolymerizable monomer, and polysulfone.

<9> The radiation sensor according to any one of <1> to <8>, wherein the charge generating agent is anthanthrone.

<10> The radiation sensor according to any one of <1> to <9>, wherein the thin film transistor includes an oxide semiconductor active layer.

<11> The radiation sensor according to <10>, wherein the oxide semiconductor active layer is an oxide semiconductor active layer containing at least one of indium (In), gadolinium (Ga) or zinc (Zn).

<12> The radiation sensor according to <11>, wherein the oxide semiconductor active layer is an oxide semiconductor active layer containing In, Ga and Zn.

<13> The radiation sensor according to any one of <1> to <12>, wherein the polymer subbing layer has a thickness of 0.05 µm to 0.2 µm.

<14> The radiation sensor according to any one of <1> to <13>, wherein at least one of the first flexible substrate and the second flexible substrate is a composite substrate of a thin glass plate and a plastic film.

<15> A radiation image detection apparatus including:
a radiation irradiation apparatus;
the radiation sensor according to any one of <1> to <14>; and
a memory unit that accumulates charge data for pixel units detected at the charge detection layer of the radiation sensor.

All publications, patent applications, and technical standards mentioned in this specification are herein incorporated by reference to the same extent as if each individual publication, patent application, or technical standard was specifically and individually indicated to be incorporated by reference.

What is claimed is:

1. A radiation sensor comprising:
   a first flexible substrate provided with a phosphor layer which converts incident radiation into an electromagnetic wave in a wavelength region that is at least different from that of the radiation;
   an organic photoelectric conversion layer which includes a charge generation layer and a charge transport layer containing a charge transporting agent and 55% by mass to 75% by mass of a polymer binder, and photoelectrically converts the electromagnetic wave;
   a second flexible substrate provided with a charge detection layer which includes a storage capacitor and a thin film transistor and is adapted to read electrical charge generated at the organic photoelectric conversion layer; and
   a polymer subbing layer disposed between the organic photoelectric conversion layer and the charge detection layer.

2. The radiation sensor according to claim 1, wherein the charge transport layer has a thickness of 1 µm to 5 µm.

3. The radiation sensor according to claim 1, wherein the polymer subbing layer is a sol-gel film obtainable by subjecting a metal alkoxide to hydrolysis and condensation.

4. The radiation sensor according to claim 3, wherein the metal alkoxide is at least one selected from an alkoxysilane, an alkoxytitanium or an alkoxyzirconium.

5. The radiation sensor according to claim 1, wherein the phosphor layer contains a phosphor which, when irradiated with radiation, converts the radiation into light having a maximum peak wavelength in a range of 500 nm to 600 nm.

6. The radiation sensor according to claim 5, wherein the phosphor is cesium iodide or gadolinium oxysulfide.

7. The radiation sensor according to claim 1, wherein the charge transport layer contains the polymer binder in an amount of 60% by mass to 70% by mass.

8. The radiation sensor according to claim 1, wherein the polymer binder contained in the charge transport layer is at least one selected from the group consisting of polycarbonate, polyvinyl butyral, a homopolymer of an acrylic acid ester or a copolymer thereof with another copolymerizable monomer, a homopolymer of a methacrylic acid ester or a copolymer thereof with another copolymerizable monomer, a homopolymer of styrene or a copolymer thereof with another copolymerizable monomer, and polysulfone.

9. The radiation sensor according to claim 1, wherein the charge generating agent is anthanthrone.

10. The radiation sensor according to claim 1, wherein the thin film transistor includes an oxide semiconductor active layer.

11. The radiation sensor according to claim 10, wherein the oxide semiconductor active layer is an oxide semiconductor active layer containing at least one of indium (In), gadolinium (Ga) or zinc (Zn).

12. The radiation sensor according to claim 11, wherein the oxide semiconductor active layer is an oxide semiconductor active layer containing In, Ga and Zn.

13. The radiation sensor according to claim 1, wherein the polymer subbing layer has a thickness of 0.05 µm to 0.2 µm.

14. The radiation sensor according to claim 1, wherein at least one of the first flexible substrate and the second flexible substrate is a composite substrate of a thin glass plate and a plastic film.

15. A radiation image detection apparatus comprising:
    a radiation irradiation apparatus;
    the radiation sensor according to claim 1; and
    a memory unit that accumulates charge data for pixel units detected at the charge detection layer of the radiation sensor.

* * * * *